United States Patent [19]

Nara

[11] Patent Number: 5,072,103

[45] Date of Patent: Dec. 10, 1991

[54] ELECTRICALLY POWERED PORTABLE MEDIUM

[75] Inventor: Seietsu Nara, Yokohama, Japan

[73] Assignee: Kabushiki Kaisha Toshiba, Kawasaki, Japan

[21] Appl. No.: 494,859

[22] Filed: Mar. 14, 1990

Related U.S. Application Data

[63] Continuation of Ser. No. 269,068, Nov. 9, 1988, abandoned.

[30] Foreign Application Priority Data

Nov. 12, 1987 [JP] Japan .................. 62-285916
Nov. 12, 1987 [JP] Japan .................. 62-285917
Nov. 12, 1987 [JP] Japan .................. 62-285921

[51] Int. Cl.$^5$ .............................. G06F 19/06
[52] U.S. Cl. ..................... 235/492; 235/487
[58] Field of Search ............... 235/492; 324/433; 320/48

[56] References Cited

U.S. PATENT DOCUMENTS 4,313,079 1/1982 Lee .
4,575,680 3/1986 Gold .
4,665,370 5/1987 Holland ............. 324/433 X
4,810,864 3/1989 Takahashi ............. 235/487

FOREIGN PATENT DOCUMENTS 0196028 10/1986 European Pat. Off. .
2596897 10/1987 France .

OTHER PUBLICATIONS

Rochelle Park, "Short Beep Means a Good Battery at Turn-On", *Electronic Design*, vol. 28 (1980), Aug., No. 17, p. 2328.
Patent Abstracts of Japan, vol. 11, No. 9 (P-634)(2456), 10 Jan. 1987.
Patent Abstracts of Japan, vol. 12, No. 443 (P-790) (3290) 22 Nov. 1988.
European Search Report re Appln EP 88 31 0551, Publication #0 316 157.

*Primary Examiner*—Harold Pitts
*Attorney, Agent, or Firm*—Cushman, Darby & Cushman

[57] ABSTRACT

An IC card which is substantially a portable medium incorporates data memory and control element composed of CPU. This IC card is provided with a keyboard and a display. In addition, IC card also incorporates a calender circuit which is constantly operated by internal battery, and battery checking circuit which causes resistor and Zener diode to generate a reference voltage. Battery checking circuit allows current to flow through the system constituents only when the power switch is activated for operating IC card. To implement power-saving operation of the system, semiconductor switches are installed between the internal battery and the battery checking circuit.

15 Claims, 7 Drawing Sheets

ELECTRICALLY POWERED PORTABLE MEDIUM

This is a continuation of Application Ser. No. 07/269,068, filed Nov. 9, 1988, which was abandoned upon the filing hereof.

BACKGROUND OF THE INVENTION

1. Field of the Invention

This invention relates to a portable medium such as a multifunctional integrated circuit (IC) card incorporating a central processor unit (CPU), a data memory, a battery and so on, which is used for calculation and timekeeping, and adapted for use with terminals.

2. Description of the Related Art

Recently, multifunctional IC cards have been developed which incorporate a CPU, a data memory, a battery and so on. The IC card itself serves as a hand-held calculator or timepiece with the aid of a keyboard and display device mounted on the top thereof. Also, the IC card may be inserted into a terminal for data transfer.

European Patent Disclosure No. 0167044 (published Aug. 1, 1986) discloses an IC card with a timepiece for displaying timepiece data such as date and time, and a calculator for performing arithmetic operations.

Where the IC card is used alone, or used in off-line operations, data processing is performed by the use of an internal battery.

The IC card includes a battery checking circuit for checking whether the voltage of the battery is above a specified voltage. The battery checking circuit continuously generates a reference voltage by the use of a Zener diode. The voltage of the battery is compared with the reference voltage, whereby the battery voltage is checked.

However, the battery checking circuit does not produce accurate voltage as the reference voltage if the electric current to the Zener diode is less than a predetermined value.

More importantly, the battery power is dissipated due to the continous nature of the reference voltage, and battery life is shortened.

SUMMARY OF THE INVENTION

It is an object of the present invention to provide a portable medium wherein it is not necessary to continuously generate a reference voltage to check battery power, thereby decreasing overall power dissipation and increasing the life of the battery.

A portable medium according to this invention comprises, a battery in the medium for supplying electric power to the medium, and detecting means responsive to electric power received from the battery only for a prescribed limited time for comparing the voltage of the battery with a predetermined threshold level.

BRIEF DESCRIPTION OF THE DRAWINGS

The embodiments of this invention will now be described by way of examples and with reference to the accompanying drawings, in which.

DETAILED DESCRIPTION OF THE PREFERRED EMBODIMENTS

Figure 1:
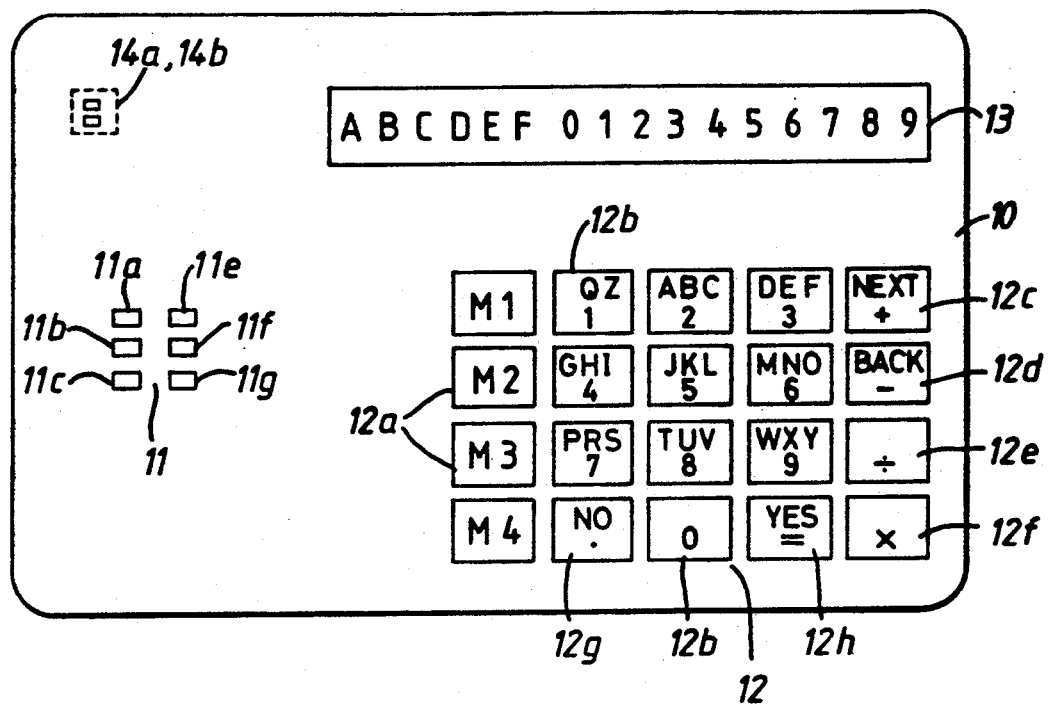
FIG. 1 is a plan view of an IC card as a portable medium according to this invention.

Referring now to FIG. 1, reference numeral 10 generally indicates a smart card, or an IC card regarded as a portable medium and having various functions. For example, IC card 10 has an on-line function in which it is used along with a terminal described later, an off-line function in which it is used alone, and a wait condition in which only timekeeping is performed.

The off-line function involves a hand-held calculator mode in which the card is used as a hand-held calculator; a time display mode for displaying the present time; a time correcting mode for correcting the time provided by the timekeeping function; an electronic pocketbook mode for recording and reading addresses, names, telephone numbers and so on; and a purchase mode in which the card is used as a credit card or a cash card. For the off-line function the card is used by itself.

For the purchase mode, the IC card 10 stores the cash balance, the expiration date, and the records of purchases. Each time a purchase is made, an amount of money for the purchase is substracted from the balance, and the purchase information is recorded in the IC card 10. Where the balance in the card runs out, or the valid date of the card has expired, the card may be renewed by the contract bank, which issues a new secret code.

On the top of IC card 10 are disposed a contact section (connection means) 11 located at a position to meet the standard of the card, and a keyboard section (input means) 12 having 20 keys as shown. Further, IC card 10 comprises a display section (display means) 13 located over keyboard section 12 and formed of a liquid crystal display device, and magnetism generating members 14a and 14b as shown.

Contact section 11 is composed of a plurality of contacts or terminals 11a–11g. Specifically, contact 11a is adapted for connection to an operation power supply voltage Vcc (+5 V), contact 11e for connection to ground, contact 11c for a clock signal, contact 11b for a reset signal, and contacts 11g for input/output of data.

Keyboard section 12 comprises mode keys (M1, M2, M3, M4) 12a for designating processing modes, ten keys 12b, and arithmetic function keys. The function keys include a addition (+) key 12c, a substraction (−) key 12d, a division (÷) key 12e, a multiplication (×) key 12f, a decimal (.) key 12g, and an equal (=) key 12h.

Mode keys 12a are depressed to select an operation corresponding to hand-held calculator mode (M1), time display mode (M2), electronic pocketbook mode (M3), or purchase mode (M4), using a terminal corresponding to a magnetic stripe. In the case of the purchase mode, a combination of M4 and ten keys 12b selects processing corresponding to the type of card being used, namely a credit card or cash card.

Addition key 12c is also used as a NEXT key, which advances the display state of display section 13 to the next state, and subtaction key 12d is also used as BACK key, which returns the display state back to the previous state. Decimal key 12g is used as a NO key and an END key also, and equal key 12h is used as YES key and POWER-ON key as well.

Display section 13 is arranged to display 16 digits, each formed of a dot matrix of 5×7. Magnetism generating members 14a and 14b are properly embedded in IC card 10 to be in alignment with tracks of a magnetic stripe card reader (magnetic head).

Figure 2:
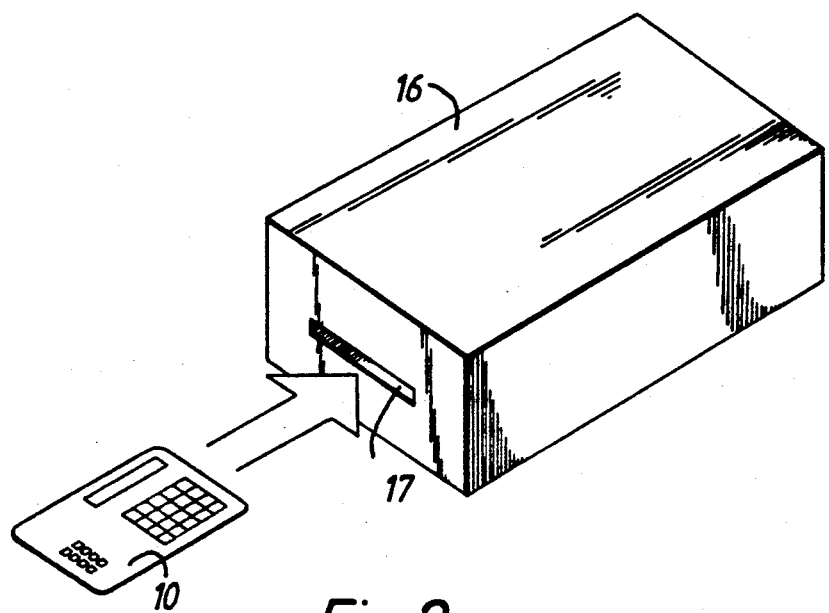
FIG. 2 shows a terminal which handles the IC card of FIG. 1.

FIG. 2 shows an IC-card handling terminal or IC card read/write unit 16 which may be used with, for example, a personal computer. By connection to contact section 11 of IC card 10 inserted into slot 17, IC card read/write unit 16 reads out data of a memory in IC card 10, or writes data into the memory. IC card read/write unit 16 is connected by a cable to the personal computer (not shown).

Figure 3:
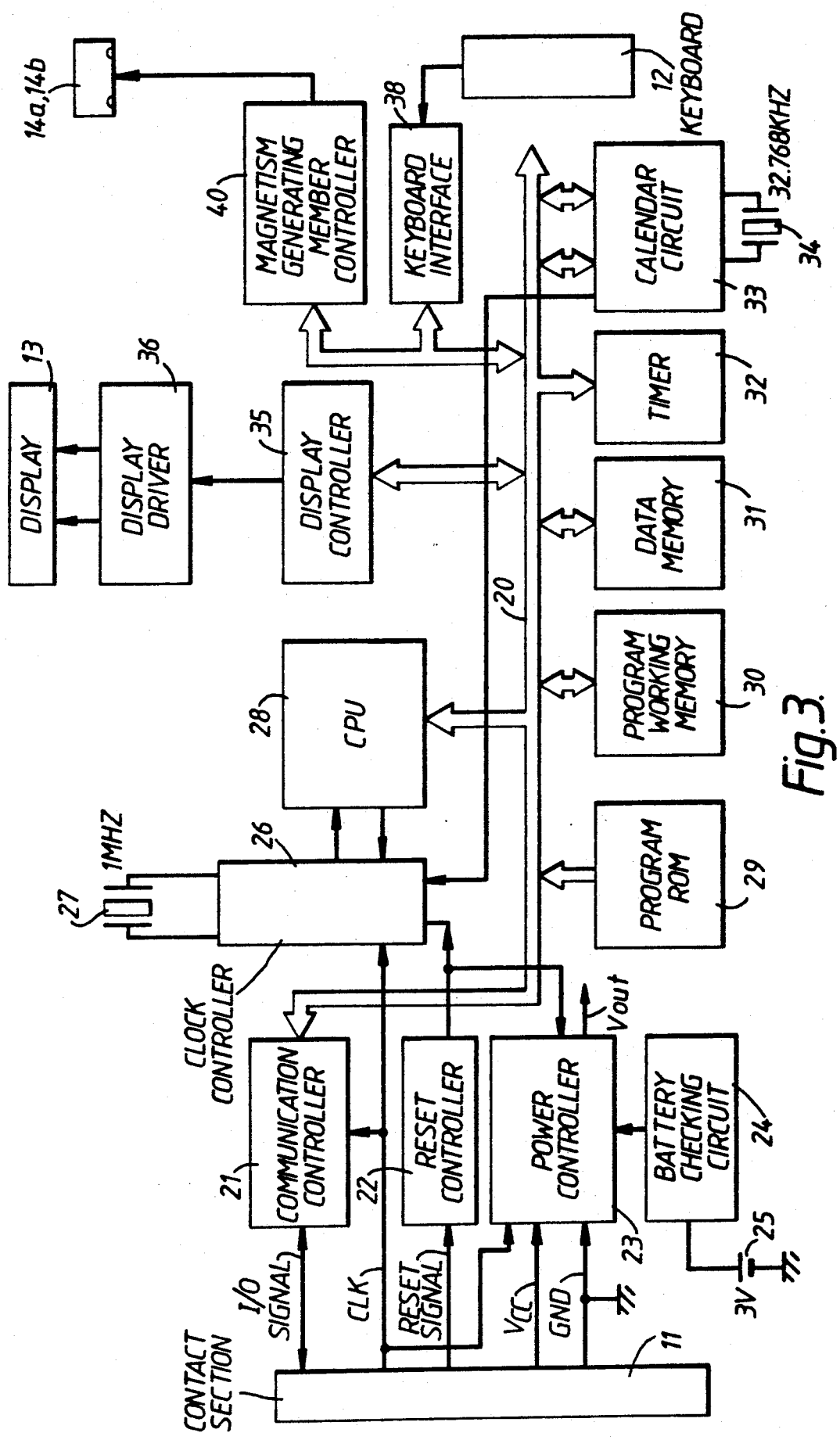
FIG. 3 is a block diagram of the electric circuitry of the IC card.

The electric circuitry of IC card 10 is arranged as shown in FIG. 3. That is, IC card 10 includes contact section 11, communication controller 21, reset controller 22, and power controller 23. Further, the IC card includes internal battery 25 of, for example, 3 volts, and battery checking circuit 24 for checking only one time when the IC card starts whether the voltage of battery 25 is above a specified voltage or not. IC card 10 includes clock controller 26, oscillator 27 having a piezoelectric crystal element for generating a high frequency signal of 1 MHz, and CPU 28. Moreover, IC card 10 incorporates a program ROM (read only memory) 29 for storing control programs, a program working memory 30, and a data memory 31 for storing a personal identification number (e.g. 4 digits) and transaction data and formed of a PROM (programmable ROM). Further, IC card 10 includes a timer 32 used for timekeeping during data processing, a calendar circuit 33, and an oscillator (first clock generator) 34 having a piezoelectric crystal element adapted for generating basic clock signals. The first clock generator is arranged to normally generate a low frequency and high precision signal of 32.768 KHz. In addition, IC card 10 includes display controller 35, display driver 36 for driving display 13, keyboard interface 38 receiving key inputs from keyboard 12, and magnetism generating member controller 40 for controlling magnetism generating members 14a and 14b.

Communication controller 21, CPU 28, ROM 29, program working memory 30, data memory 31, timer 32, calendar circuit 33, display controller 35, keyboard interface 38, and magnetism generating member controller 40 are interconnected by data bus 20.

Upon reception of a serial input signal fed via contact section 11 from terminal 16, communication controller 21 converts the serial input signal into a parallel signal which is in turn output to data bus 20. Upon receiving a parallel signal from data bus 20, communication controller 21 converts the parallel signal into a serial output signal which is output through contact section 11 to terminal 16. In this case the conversion formats are previously defined by terminal 16 and IC card 10.

Reset conroller 22 generates a reset signal to start CPU 28 when an on-line operation is initiated. Power controller 23 switches the driving power supply from battery 25 to an external power supply after a predetermined time from the initiation of an on-line operation. When the operation is changed from on-line to off-line, namely when the external power supply voltage is lowered, power controller 23 switches the driving power supply from the external power supply to the internal power supply or battery 25.

Battery checking circuit 24 generates reference voltage Vref from the voltage value of internal battery 25 by means of a Zener diode. This circuit 24 then operates comparator to check battery life by comparing the reference voltage Vref to the checking voltage VCH, which is generated by dividing the voltage of internal battery 25. When the voltage value of internal battery 25 falls below 2.5 VDC, battery checking circuit 24 outputs a battery alarm signal to CPU 28. Before displaying the time and date by depressing the power key while the off-line mode (i.e., detection) is underway, battery checking circuit 24 only once allows current to flow through the circuit, which generates reference voltage Vref and checking voltage VCH. As a result, when generating a battery alarm, instead of time and date, "CALL BANK" for example is generated to warn the user of the IC card that the battery life is no longer available for use. On the other hand, while no battery alarm is generated, the battery checking circuit 24 allows the time and date to be displayed so that the user can proceed with selection of the ensuing menu as required.

During the off-line mode using internal battery 25 for card operations, clock controller 26 stops oscillator circuit (second clock generator), to generate the 1 MHz signal, and stops the supply of clock signals to CPU 28 when keyboard data is not entered for a give time. Thus, clock controller 26 is completely halted and on stand-by.

Data memory 31 stores information as to user's credit cards (companies) and information as to user's cash card (banks). The information is read out in correspondence with the type of card selected by a combination of the M4 key and the keys 12b, or by digits displayed on display 13 and the abbreviated words of the credit company names and bank names with the use cf ten keys 12b. The information is the same as information recorded on a conventional magnetic stripe of each card. For this reason data memory 31 stores first track data corresponding to the first track of the magnetic stripe card and second track data corresponding to the second track of the magnetic stripe card.

Further, data memory 31 stores the account number and a limited monetary amount that can be applied for purchases with the cash card by off-line processing during the purchase mode. The limited amount of money for purchases is reduced each time a purchase is made. A purchase number resulting from the purchase is recorded in a purchase situation recording area (not shown) of data memory 31.

Calendar circuit 33 comprises a displaying timepiece (first timepiece) which can be freely set by the user of the card, and a purchasing timepiece (second timepiece) in which a standard time such as Japanese Standard time and Greenwich Time is set at the time of issuance of the card.

Display controller 35 converts display data from CPU 28 to character patterns using a character generator (not shown) formed of a ROM in the controller. The character patterns are displayed by display section 13 with the aid of display driver 36. Keyboard interface 38 feeds CPU 28 with key input signals corresponding to keys depressed on keyboard 12.

When the purchase mode and the type of the card are specified, magnetism generating member controller 40 drives magnetism generating members 14a and 14b in accordance with data read out from data memory 31 and corresponding to the type of the card. In this case, the magnetic information includes first track data and second track data, so that IC card 10 is held in the same condition as in the case where the conventional magnetic stripes exist.

Figure 4:
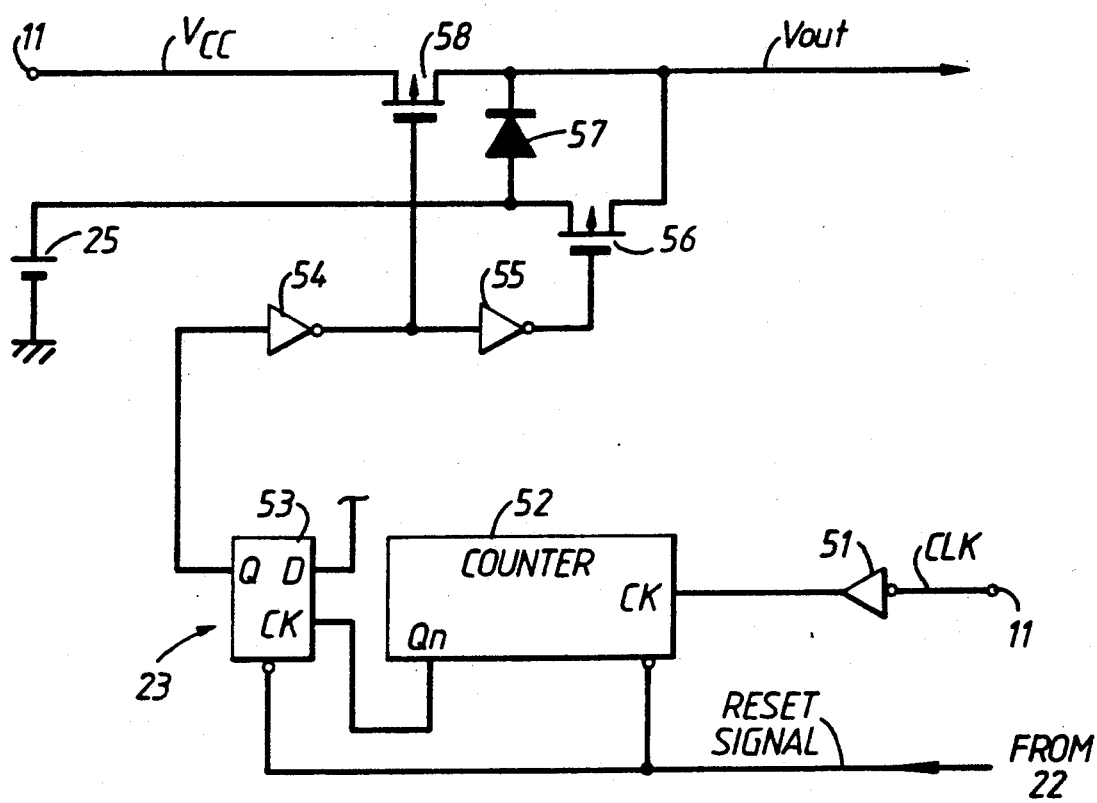
FIG. 4 shows an arrangement of the power controller of FIG. 3.

The power controller 23 will be described in detail referring to FIG. 4. As is shown, power controller 23 is made up of inverters 51, 54 and 55, counter 52, D type flip-flop (FF) 53, semiconductor switches 56 and 58 made up of MOSFETs, and diode 57. Power controller 23 is connected to internal battery 25, through battery checking circuit 24 (not shown in FIG. 4).

The count of counter 52 is not influenced by fluctuation of the external power supply. Diode 57 protects power voltage Vout. It keeps the power voltage Vout by using internal battery 25, when the external power voltage Vcc drops below the drive voltage for the memory before semiconductor switch 56 is turned on.

Figure 5:
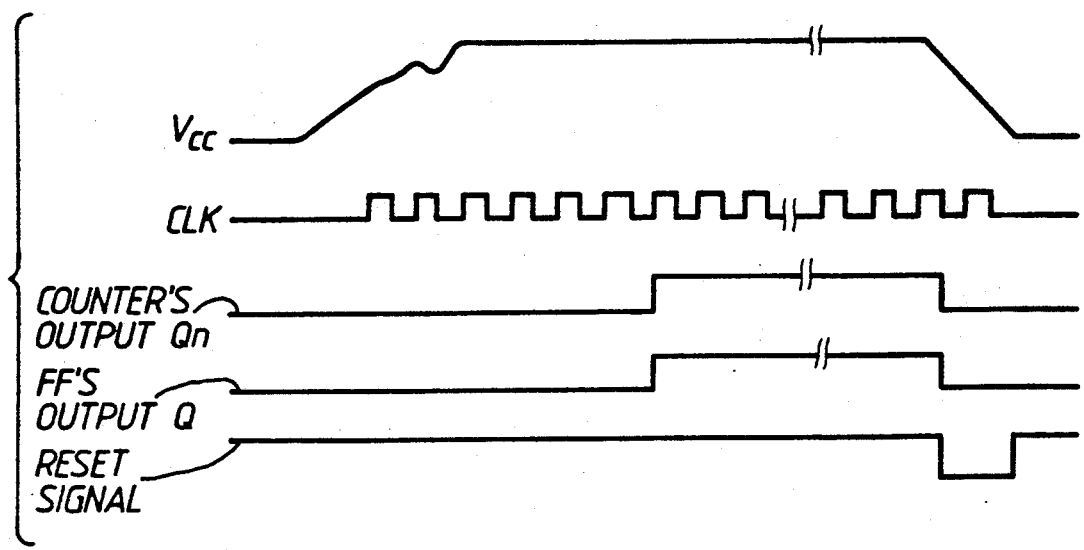
FIG. 5 is a timing chart useful for explaining the operation of the power controller of FIG. 4.

The operation of the IC card thus arranged will be described referring to FIG. 5 illustrating a timing chart. When IC card 10 is not connected to terminal device 16 at contact section 11, semiconductor switch 56 is turned on. The power voltage of internal battery 25 is distributed as the output Vout of power controller 23 to the related portions, via semiconductor switch 56.

When IC card 10 is connected to terminal device 16 at contact section 11, the external power voltage Vcc is supplied via contact 11a of contact section 11 to the gate of semiconductor switch 58. The clock signal CLK coming through contact section 11 from the external terminal is supplied to the clock terminal CK of counter 52, via contact 11c of section 11 and inverter 51. Upon receipt of this, counter 52 starts its counting. When the count of counter 52 reaches a predetermined value, the output of output terminal Qn sets FF 53. The set output Q of FF 53 places a "1" signal at the gate of semiconductor switch 58. A "0" signal is placed at the gate of semiconductor switch 56. Accordingly, semiconductor switch 58 is turned on, while switch 56 is turned off. The power voltage Vcc from the external terminal is applied as the output Vout of power controller 23 to the related portions via semiconductor switch 58.

When the IC card is returned from the on-line mode to the off-line mode, if the power voltage Vcc drops, reset controller 22 produces a reset signal. This reset signal resets counter 52 and FF 53. Then, a "0" signal is supplied to the gate of semiconductor switch 58, and a "1" signal is supplied to the gate of semiconductor switch 56. Then, switch 58 is turned off and switch 56 is turned on. As a result, the power voltage of battery 25 is supplied as the output Vout from power controller 23 to the related circuits, through semiconductor switch 56.

Figure 6:
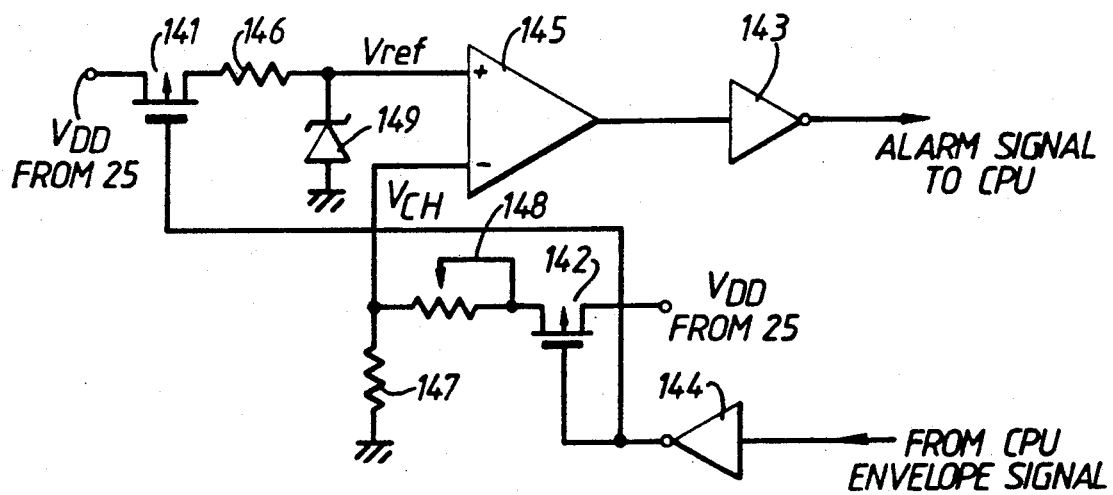
FIG. 6 shows an arrangement of the battery checking circuit of FIG. 3.

Referring now more particularly to FIG. 6, the functional operation of the battery checking circuit 24 is described below.

Battery checking circuit 24 is comprised of semiconductor switches 141 and 142, inverter circuits 143 and 144, differential amplifier 145 functioning as a comparator, resistors 146 and 147, variable resistor 148, and Zener diode 149, respectively. During the production process, the resistance value of variable resistor 148 is properly arranged. Specifically, when the voltage value VDD of internal battery 25 is below 2.5 VDC, checking voltage VCH delivered to the inversion input terminal of differential amplifier 145 is lower than the reference voltage Vref delivered to non-inversion terminal of this amplifier, thus allowing differential amplifier 145 to output the battery alarm signal to CPU 28. The resistance value of variable resistor 148 is correctly adjusted to the level where the battery alarm signal can be generated.

Assume that CPU 28 delivers the envelope signal to the bases of semiconductor switches 141 and 142 via inverter circuit 144. This activates semiconductor switches 141 and 142 to allow reference voltage Vref generated by Zener diode 149 to be delivered to the non-inversion input terminal of differential amplifier 145. In addition, checking voltage VCH generated by division of voltage VDD of internal battery 25 by means of variable resistor 148 and resistor 147, is delivered to inversion input terminal of differential amplifier 145. As a result, if the checking voltage VCH is lower than reference voltage Vref, differential amplifier 145 outputs the battery alarm signal to CPU 28 via inverter circuit 143.

In this way, since the battery checking circuit 24 allows current to flow through Zener diode 149 and resistor 147 only when checking the battery voltage, power and current are saved in comparison to a constant flow of current. Next, system operation using the constitution mentioned above is described below. First, the description refers to off-line function using IC card 10. Normally, IC card 10 activates only the timepiece, whereas CPU 28 remains in HALT mode as mentioned above. In the HALT mode, no external control is applicable to IC card 10 except for depressing the YES key 12h and activation of the on-line mode.

Now, YES key 12h which is substantially the power-ON key is depressed. This causes keyboard interface 38 to output a key-input interruption signal to clock control circuit 26. Then, clock control circuit 26 feeds clock pulses to CPU 28 so that CPU 28 can be released from the HALT mode. This allows the system to activate those functional operations mentioned above.

After being activated, CPU 28 reads seconds, minutes, and hour data for the display from calender circuit 33. CPU 28 also reads day, month, year, and weekday data from data memory 31, and then converts these data into the designated format before eventually delivering these to display control circuit 35. As a result, using a character generator (not shown) inside of display control circuit 35, it converts these data into character patterns, and finally, using display driver 36, the date and time are alternately displayed on display 13. This allows a date and time message for activating system operation to be displayed on display 13. Simultaneously, CPU 28 enters into standby mode for accepting the entry of data from the keys on keyboard 12.

When being activated, CPU 28 accesses battery checking circuit 24 to check the voltage of battery 25 before displaying the date and time, mentioned above. If the voltage value of battery 25 is low, then CPU 28 causes display 13 to display a message like "CALL BANK", for example, and then, it totally inhibits use of IC card 10 under the off-line mode. Specifically, simultaneous with activation of CPU 28, CPU 28 outputs the envelope signal to the bases of semiconductor switches 141 and 142 via inverter circuit 144. This activates semiconductor switches 141 and 142 so that reference voltage Vref generated by Zener diode 149 can be delivered to the non-inversion input terminal of differential amplifier 145. At the same time, checking voltage VCH generated by division of voltage value VDD of internal battery 25 by means of variable resistor 148 and resistor 147 is delivered to the inversion input terminal of differential amplifier 145.

Consequently, if the checking voltage VCH is lower than the reference voltage Vref, differential amplifier 145 outputs the battery alarm signal to CPU 28 via inverter circuit 143. On receipt of the battery alarm signal, CPU 28 causes display 13 to display a message such as "CALL BANK" for example, thus warning the operator that the battery life is exhausted and inhibiting the operator from using IC card 10 in the off-line mode.

Figure 7:
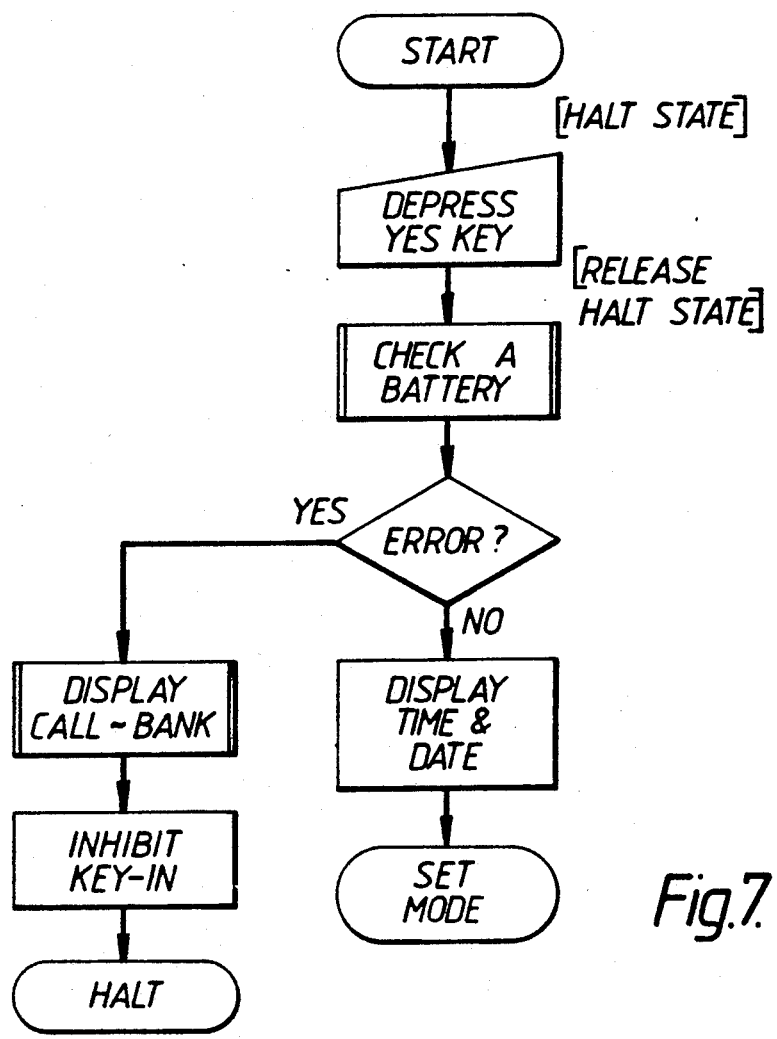
FIG. 7 shows a flowchart for checking the voltage of a built-in battery.

Conversely, if the checking voltage VCH is higher than the reference voltage Vref, differential amplifier 145 does not output the battery alarm signal so that the system can display the ensuing time and date. FIG. 7 represents flowchart of the operation of the battery checking circuit 24 for detecting voltage.

With time and date in display, the system can sequentially display various modes by depressing addition key 12c which functions as a mode selection key. As a result, if the YES key 12h is depressed while the purchase mode is on display, this mode is selected for entry. This causes CPU 28 to operate display 13 so that is displays an accepted message and demand for the entry of a recited number. As mentioned above, in response to the selected CPU 28 causes clock control circuit 26 to activate oscillation of clock pulses at a very fast speed.

After visually confirming the demand for entry of a personal identification number (PIN) on display, the user of IC card 10 then inputs the PIN by operating digital keys 12b. CPU 28 then checks to see if the input PIN correctly matches the one registered in the IC card 10, or not. If it is identified to be correct, the system proceeds to the ensuing processes. Even though CPU 28 identifies that an incorrect PIN is input, if the user inputs the correct PIN within three tries, a PIN error counter inside of IC card 10 is reset to allow the system to proceed to the following processes. Conversely, if the user inputs an incorrect PIN three times, CPU 28 causes display 13 to display "PIN ERROR". If this occurs, the user can no longer use this IC card until the PIN ERROR is duly cancelled by means of a secret code presented by the card-associated bank. This in turn securely promotes total safety of the IC card 10.

If the user correctly inputs the PIN, CPU 28 causes display 13 to display the first menu of the purchase mode "Do you shop?". Now, if the user depresses the YES key 12b, then the purchase mode is entered. If the user repeatedly depresses mode-selection key 12c, predetermined menus of the purchase mode are sequentially shown on display 13.

When the purchase mode is entered, a demand for entry of the amount spent in the selected currency is shown of display 13.

Next, in response to the message shown on display 13, the user inputs the amount spent by means of ten keys 12b. Then, CPU 28 generates a trade-established code by applying random numbers. CPU 28 then causes display 13 to alternately display the generated code and the amount spent.

The user then delivers his IC card 10 to a store employee. The store employee inserts IC card 10 in a terminal provided with a magnetic stripe reader. Then, he depresses YES key 12h of this IC card 10. CPU 28 controls magnetism-generating member control circuit 40 to allow data identical to that of any conventional magnetic stripe card to be delivered from magnetism-generating members 14a and 14b to the magnetic head of this terminal equipment. If the terminal equipment properly accepts the delivered data, then the shopping is completed, thus terminating the purchase mode.

When the user uses IC card 10 in a store where no card terminal device is installed, the store employee takes note of the transaction code, or imprints the characters embossed on card 10 onto a sales slip of a specific form.

Next, the on-line function of IC card 10 will be described, When the card user inserts IC card 10 into IC card read/write unit 16 through slot 17 opened in the housing of unit 16, contact section 11 of IC card 10 is connected to the contact section (not shown) of unit 16. Then, the power-supply voltage signal is supplied from unit 16 via section 11 to power controller 23, and the reset signal is supplied from unit 13 to reset controller 22, as is shown in FIG. 3. Power controller 23 checks the power-supply voltage, and disconnects internal battery 25 from battery checking circuit 24, so that IC card 10 is driven by only the externally applied power-supply voltage. In response to the reset signal, reset controller 22 generates a reset signal, which drives CPU 28. In this case, CPU 28 operates in synchronism with the clock signal output by IC card read/write unit 16.

At the end of the duration of the reset signal supplied from unit 16, CPU 28 starts executing the program stored in program ROM 29, executing the 0th address of program ROM 29 first. More specifically, CPU 28 checks the condition of the externally applied voltage. If no drop of the externally applied voltage is detected, CPU 28 executes the program of the on-line mode. More precisely, the protocol data stored within IC card 10 is transferred to IC card read/write unit 16, and then waits for instructions coming from unit 16. Once unit 16 has received a correct I/O signal from IC card 10, it demands that data be transferred to it from IC card 10, that data be rewritten in IC card 10, or that new data be written into IC card 10, in accordance with the application program stored in unit 16. IC card 10 stops operating in the on-line mode when unit 16 stops supplying the power-supply voltage to IC card 10, or when IC card 10 is drawn from unit 16.

As mentioned above, battery checking circuit does not constantly detect the voltage of internal battery, but it only detects the voltage of internal battery once before the user actually starts to use the IC card under off-line mode. More particularly, it detects the voltage of the internal battery before displaying the time and date on the display section only after activating operation of the CPU. Consequently, compared to constant detection of voltage of internal battery, the battery checking circuit of the invention saves power and current, and at the same time, it extends the service life of the internal battery.

Furthermore, since there is no need of constantly detecting the voltage of the internal battery, the system can sufficiently supply current throughout the battery checking circuit, thus correctly providing the reference voltage value for detecting the voltage of the internal battery. It is also possible for the battery checking circuit related to the invention to detect the voltage of the internal battery once a day, for example, at the moment of changing the date in calendar circuit 33.

Figure 8:
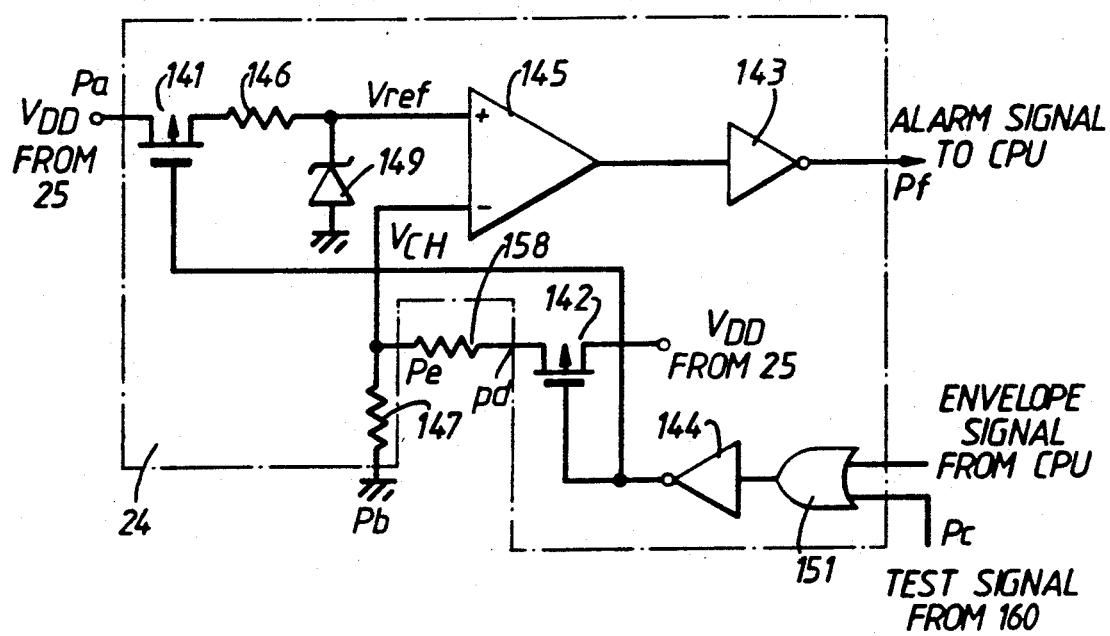
FIG. 8 shows an arrangement of the battery checking circuit of FIG. 3 according to another embodiment of this invention.
Figure 9:
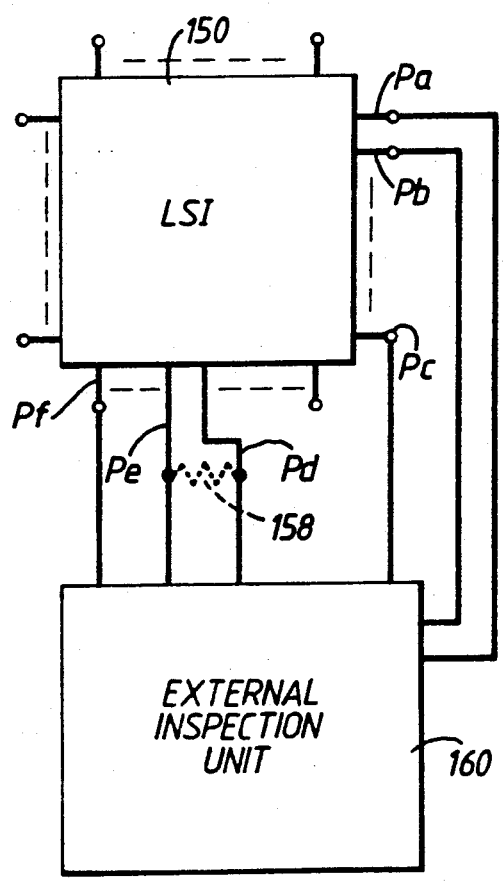
FIG. 9 shows a connecting view of an LSI embedded in the IC card and an external inspection unit.

The above preferred embodiment has referred to the introduction of a variable resistor which generates checking voltage VCH. Referring now to FIGS. 8 and 9, another preferred embodiment is described below. Those constituents shown in FIG. 8 are identical to those which are shown in FIG. 6 except for the external connection of resistor 158 and the supply of test signals via OR circuit 151.

Resistor 158 is connected to the external portion of LSI 150. Only those resistors 158 are selected from a production line, which are respectively provided with a specific resistance value allowing differential amplifier 145 to output the battery alarm signal. In particular, when the voltage value VDD of internal battery 36 drops below 2.5 VDC, the level of checking voltage VCH delivered to the inversion input terminal of differential amplifier 145 becomes lower than that of reference voltage Vref delivered to the non-inversion input terminal, thus causing differential amplifier 145 to output the battery alarm signal.

Figure 12:
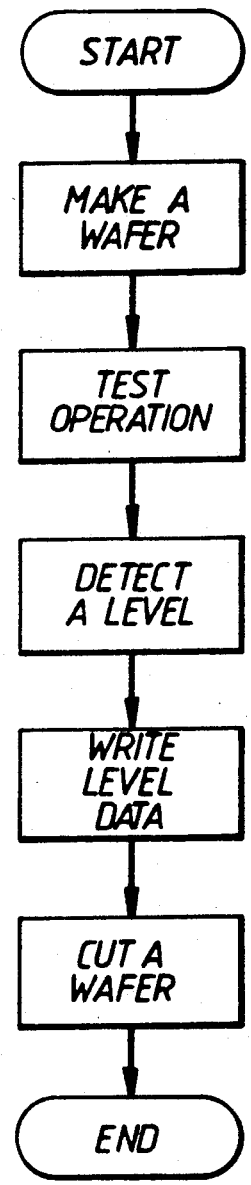
FIG. 12 shows a flowchart for explaining the operation of manufacturing the LSI.

Referring now to FIG. 12, a method of selecting resistor 158 is described below. First, external inspection unit 160 is connected to LSI 150. The external inspection unit 160 is composed of those elements including relays (not shown) and a plurality of resistors each being provided with a variety of resistance values selected by relays. The external inspection unit 160 feeds 2.5 V DC to pads Pa and Pb which are used for internal battery 25 of LSI 150. It also outputs a test signal to test pad Pe so that these resistors selected by relays can be inserted between pads Pa and Pe. While maintaining this condition, the resistance value at the time of delivering the battery alarm signal from output pads Pf is selected for use with resistor 158 by switching relays and operating resistors having resistance values different from each other.

External inspection unit 160 feeds test signals to the bases of semiconductor switches 141 and 142 via OR circuit 150 and inverter circuit 144, respectively. This activates semiconductor switches 141 and 142 so that reference voltage Vref generated by the Zener diode can be delivered to the non-inversion input terminal of differential amplifier 145. The checking voltage generated by division of voltage value VDD of the internal battery by means of a resistor (not shown) of the external inspection unit 160 and resistor 147 is also divided to inversion input terminal of differential amplifier 145. As a result, if the level of checking voltage VCH is lower than that of reference voltage Vref, differential amplifier 145 outputs the battery alarm signal to the external inspection unit 160 via inverter circuit 143.

When the battery checking circuit 24 is internally set to LSI 150, in order to prevent each production lot from incurring different reference voltage levels for detecting the voltage of internal battery, as mentioned above, one of those resistors of battery checking circuit 24 is externally provided so that inspection staff of the factory can select only those which are properly manufactured. This securely prevents occurrence of variations in the reference voltage and allows accurate detection of the voltage of internal battery 25.

Figure 10:
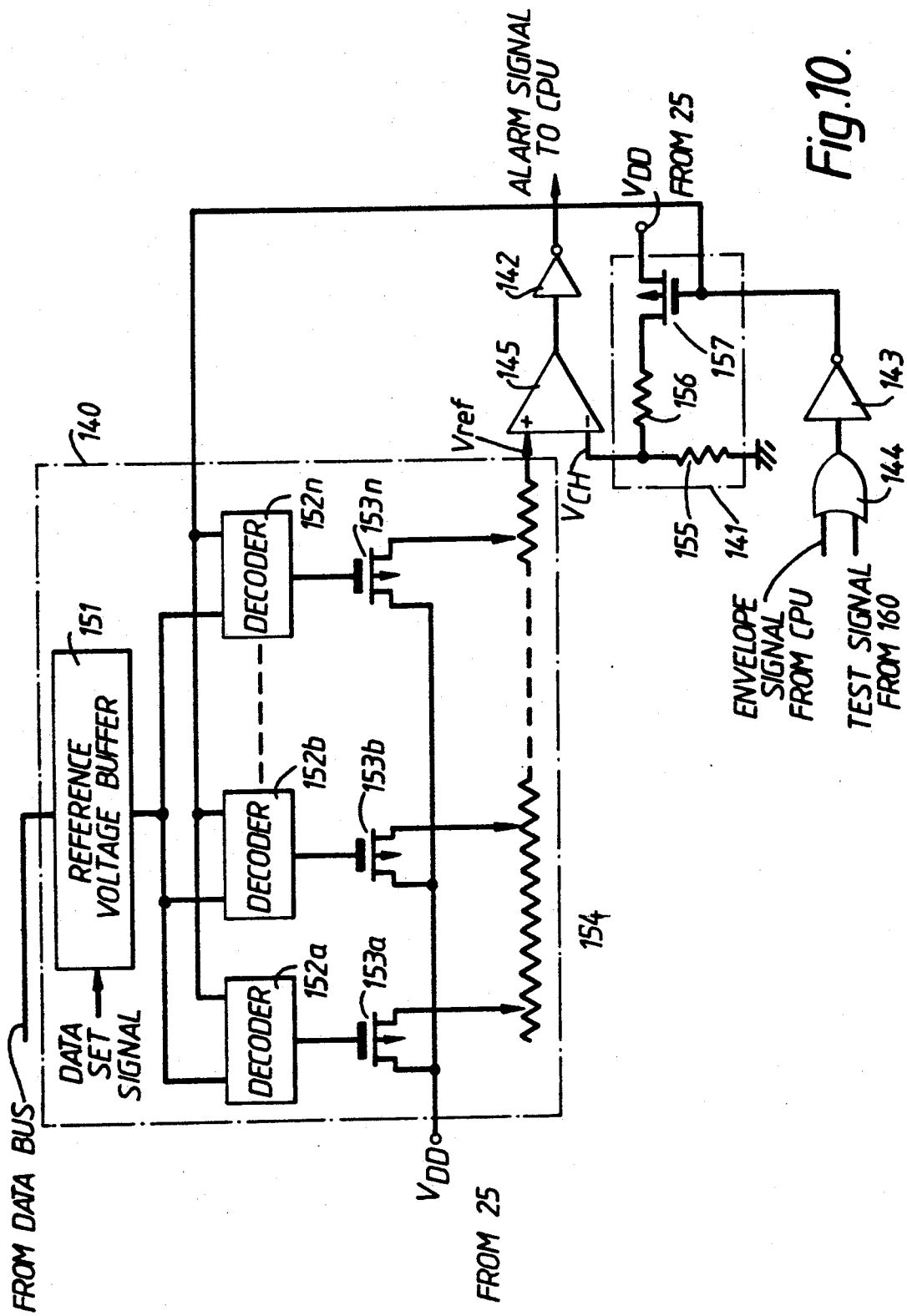
FIG. 10 shows an arrangement of the battery checking circuit of FIG. 3 according to another embodiment of this invention.
Figure 11:
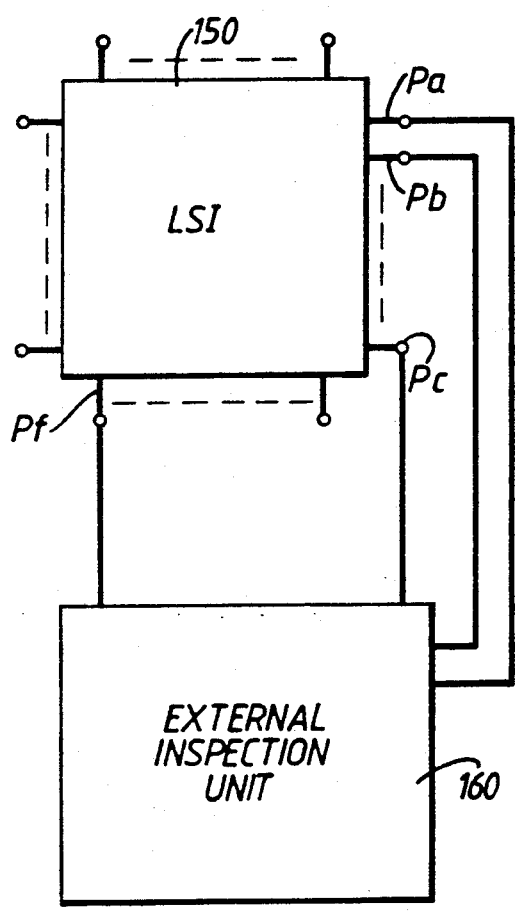
FIG. 11 shows a connecting view of the LSI embedded in the IC card and an external inspection unit.

Referring now to FIGS. 10 through 12, another preferred embodiment of the circuit for detecting the voltage of the internal battery is described below. Battery checking circuit 24 is comprised of reference-voltage generator 140, test-voltage generating circuit 141, inverter circuits 142 and 143, or circuit 144, and differential amplifier 145 functioning as a comparator, respectively. Reference-voltage generating circuit 140 is comprised of reference-voltage buffer 151, a plurality of decoders 152a–152n, a plurality of semiconductor switches 153a–153n, and resistor 154, respectively. The test-voltage generating circuit 141 is comprised of resistors 155 and 156, and semiconductor switch 157, respectively.

Data memory 31 (shown in FIG. 3) allows a plurality of digital data corresponding to reference voltages used for the battery checking circuit during the production stage to be recorded in the reference data area. When the power key is activated, those digital data in the reference data area are delivered to battery checking circuit 24. After entry of these digital data, the reference data area is made available for the data-processing area.

CPU 28 delivers envelope signals to the bases of decoders 152a–152n and semiconductor switch 157 via OR circuit 144 and inverter circuit 143. This activates decoders 152a–152n and also causes the voltage value VDD of the internal battery to be delivered to an optional position (having different resistance values) of resistor 154 via semiconductor switches 153a–153n which are respectively activated by one of those operative decoders 152a–152n. At the same time, reference voltage Vref generated in correspondence with voltage value VDD sent to an optional position or resistor 154, is delivered to the non-inversion input terminal of differential amplifier 145. In addition, checking voltage VCH generated by division of voltage value VDD of the internal battery by means of resistors 155 and 156 is delivered to the inversion input terminal of differential amplifier 145. As a result, if the checking voltage VCH is lower than reference voltage Vref, differential amplifier 145 outputs the battery alarm signal to CPU 38 via inverter circuit 142.

In this way, since the battery checking circuit 24 allows current to flow through resistors 154 through 156 only when checking the voltage of the internal battery, the system can securely save power and current in contrast with constant flow of current in the prior art.

While the manufacturing process is underway, selection is made for digital data of the reference voltage for reference voltage buffer 151, so that differential amplifier 145 can be allowed to output the battery alarm signal in the event voltage value VDD of internal battery 25 drops below 2.5 VDC. If this occurs, the level of checking voltage VCH delivered to the inversion input terminal of differential amplifier 145 is lower than that of reference voltage Vref delivered to the non-inversion input terminal of this amplifier 145. As a result, differential amplifier 145 outputs the battery alarm signal.

Referring now to the schematic diagram shown in FIG. 11 and the flowchart shown in FIG. 12, a method of setting digital data is described below.

For example, first, tests are executed for checking the functional performance of a wafer made available for LSI 150. Then, further tests are executed for determining the functions needed for checking the voltage of the internal battery before eventually recording the test results in part of data memory 31 using identical data having a plurality of bytes. To implement those tests, external inspection unit 160 is connected to LSI 150.

External inspection unit 160 feeds 2.5 V DC to pads Pa and Pb of internal battery 25 stored in LSI 150, and then it outputs a test signal to test pad Pe so that sequentially selected digital data can be delivered to pad Pd. This allows the external inspection unit 160 to feed test signals to the base of decoders 152a–152n and semiconductor switch 157 via OR circuit 144 and inverter circuit 142.

When one of digital data is stored in reference voltage buffer 151, in response to the digital data output from this buffer 151, one of decoders 152a–152n, i.e., any of decoders 152a–152n corresponding to the delivered digital data, outputs signals to the base of the corresponding semiconductor switch 153a so that this can be activated. Consequently, voltage value VDD of internal battery 25 is delivered to an optional position of resistor 154, and then, reference voltage Vref is delivered to the non-inversion input terminal of differential amplifier 145. In addition, checking voltage VCH generated by division of voltage value VDD of the internal battery by means of resistors 155 and 156 is delivered to the inversion input terminal of differential amplifier 145.

Consequently, if the level of checking voltage VCH is lower than that of reference voltage Vref, then, differential amplifier 145 outputs the battery alarm signal to external inspection unit 160 via inverter circuit 142.

If another digital data were stored in reference voltage buffer 151, one of semiconductor switches 153a–153n corresponding to the signal output from another decoder is activated. This allows generation of reference voltage Vref corresponding to the position of resistor 154, which receives voltage value VDD. Battery checking circuit 24 compares checking voltage VCH to reference voltage Vref.

The system allows data memory 31 shown in FIG. 3 to record digital data in its own reference data area when the output pad Pf outputs the battery alarm signal. These digital data function as reference data for detecting the voltage level in the internal battery 25, where identical data are recorded in plural bytes.

After completing those sequential processes mentioned above one or two months later, LSI 150 is finally cut off and connected to the subtrate of the IC card by means of bonding. The basic IC card is then provided with additional constituents to which internal battery 25 is eventually connected, so that the IC card can be operated.

After completing final process for inspecting functional performance of the complete IC card, factory staff read the plurality of digital data recorded in the reference data area of data memory 31 and select proper digital data having the largest content by the majority decision, and finally, the selected data are stored in the reference voltage buffer 151. After completing this process, the reference data area of data memory 31 is made available as a data processing area.

It is likely that each production lot of complete LSIs 150 incorporating a battery checking circuit 24 contains some LSIs having non-uniform reference voltages. To prevent this, factory staff select the proper digital data suited for generating the proper reference voltage in the battery checking circuit 24. This in turn securely prevents variations in the reference voltage used for checking the voltage of internal battery 25 and allows the battery checking circuit 24 to precisely detect the voltage of the internal battery 25.

What is claimed is:

1. An electrically powered portable medium, comprising:
   a battery in the medium for supplying electric power to the medium;
   detecting means, responsive to electric power received from the battery only once for a prescribed limited time after said medium is activated and before said medium is used, for comparing a voltage of the battery with a predetermined threshold level; and
   a central processing unit for controlling said detecting means and for processing data, at least a portion of said data being provided to said medium by an external device.

2. The portable medium of claim 1 also including a central processing unit (CPU) for processing data, and means for generating a clock signal corresponding to actual time, the medium having a plurality of operational modes, including a HALT mode wherein the clock signal is not supplied to the CPU, and an ON mode wherein the clock signal is supplied to the CPU.

3. The medium of claim 2 wherein the detecting means includes circuit means for comparing the voltage of the battery with the predetermined threshold level for the limited time only when the medium is in the ON mode.

4. The medium of claim 1 also including timekeeping means for activating the detecting means at predetermined intervals.

5. The medium of claim 1 wherein the detecting means includes reference voltage generating means for generating a reference voltage having the predetermined threshold level and comparison means for comparing the reference voltage with the voltage of the battery.

6. The medium of claim 5 wherein the reference voltage generating means includes a Zener diode.

7. The medium of claim 6 wherein the detecting means further includes switching means for selectively allowing current to flow through the Zener diode.

8. The medium of claim 5 also including a memory having digital data stored therein, and wherein the reference voltage generating means includes means for producing an analogue signal in response to the digital data, the analogue signal being supplied to the comparison means.

9. The medium of claim 8 wherein the digital data includes a plurality of data elements each having a corresponding value, and the reference voltage generating means includes means for automatically selecting one of the data elements having a value corresponding to the value of the majority of the data elements, the reference voltage generating means being responsive to the selected one of the data elements.

10. The medium of claim 5 wherein the detecting means includes dividing means for generating a checking voltage corresponding to the voltage of the battery and the dividing means includes resistor means for stabilizing the checking voltage.

11. An electrically powered portable medium, comprising:
   a control element for processing data supplied to the medium;
   display means responsive to the control element for displaying data;
   a battery mounted in the medium for supplying electric power to the control element and the display means; and detecting means, responsive to electric power received from the battery only once for a prescribed limited time after said medium is activated and before said medium is used, for comparing the voltage of the battery with a predetermined threshold level.

12. The medium of claim 11 also including timepiece means for generating timepiece data and supplying the timepiece data to the display means after the comparison by the detecting means.

13. An electrically powered portable medium, comprising:
  a battery in the medium for supplying electric power to the medium;
  detecting means, responsive to electric power received from the battery only once for a prescribed limited time after said medium is activated and before said medium is used, for comparing the voltage of the battery with a predetermined threshold level;
  a central processing unit (CPU) for processing data; and
  means for generating a clock signal corresponding to actual time, the medium having a plurality of operational modes, including a HALT mode wherein the clock signal is not supplied to the CPU, and an ON mode wherein the clock signal is supplied to the CPU.

14. An electrically powered portable medium, comprising:
  a battery in the medium for supplying electric power to the medium;
  detecting means responsive to electric power received from the battery only once for a prescribed limited time for comparing the voltage of the battery with a predetermined threshold level, the detecting means including circuit means for comparing the voltage of the battery with the predetermined threshold level for the limited time only after said medium is activated and before said medium is used; and
  a central processing unit for controlling an operation of said detecting means and for processing data, at least a portion of said data being provided to said medium by an external device.

15. An electrically powered portable medium, comprising:
  a control element for processing data supplied to the medium;
  display means responsive to the control element for displaying data;
  a battery mounted in the medium for supplying electric power to the control element and the display means; and
  detecting means responsive to electric power received from the battery only once for a prescribed limited time for comparing the voltage of the battery with a predetermined threshold level, the detecting means including circuit means for comparing the voltage of the battery with the predetermined threshold level for the limited time only after said medium is activated and before said medium is used.

* * * * *